United States Patent [19]
Pinkham

[11] Patent Number: 4,817,058
[45] Date of Patent: Mar. 28, 1989

[54] MULTIPLE INPUT/OUTPUT READ/WRITE MEMORY HAVING A MULTIPLE-CYCLE WRITE MASK

[75] Inventor: Raymond Pinkham, Missouri City, Tex.

[73] Assignee: Texas Instruments Incorporated, Dallas, Tex.

[21] Appl. No.: 53,200

[22] Filed: May 21, 1987

[51] Int. Cl.$^4$ .............................................. G11C 8/00
[52] U.S. Cl. ..................................... 365/230; 365/195
[58] Field of Search .................... 365/189, 230, 195

[56] References Cited

U.S. PATENT DOCUMENTS

| | | | |
|---|---|---|---|
| 3,761,902 | 9/1973 | Weinberger | 365/49 |
| 4,044,338 | 8/1977 | Wolf | 365/49 |
| 4,159,538 | 6/1979 | Motsch | 365/230 |
| 4,636,986 | 1/1987 | Pinkham | 365/189 |

OTHER PUBLICATIONS

Hitachi Semiconductor & Integrated Circuits Div., "Preliminary Target Spec. Hm53462-10/12/15" Jun. 7, 1985.

Primary Examiner—James W. Moffitt
Attorney, Agent, or Firm—Rodney M. Anderson; Leo N. Heiting; Melvin Sharp

[57] ABSTRACT

A dual-port random access memory with multiple random inputs is disclosed which has a write mask register. The write mask allows a random write operation to occur on a subset of the random inputs, with the selected memory cells remaining undisturbed by the write operation. The write mask register provides for storage of the write mask information for a plurality of cycles, including intervening cycles which are unmasked writes. The write mask register may be loaded in two separate modes, either early in a cycle in conjunction with the row address strobe signal, or later in the cycle in conjunction with the write enable signal.

11 Claims, 9 Drawing Sheets

MULTIPLE INPUT/OUTPUT READ/WRITE MEMORY HAVING A MULTIPLE-CYCLE WRITE MASK

The subject invention is in the field of memory devices, specifically random access semiconductor memory devices having multiple input terminals.

BACKGROUND OF THE INVENTION

With the advent of less expensive semiconductor memory, modern computer and microcomputer systems have been able to use bit-mapped video displays for the output of data from the system. As is well known, a bit-mapped display requires a memory which can store at least one binary digit (bit) of information for each picture element (pixel) of the display device. Additional bits stored for each pixel provide the capability of the system to render complex images on the video display, such as multi-color images, and background and foreground images, such as a graphics background with textural information overlaid thereupon. The use of bit-mapped storage also allows for data processing operations to easily generate and modify the stored image.

Modern video display devices are often of the raster-scan type, where an electron gun traces horizontal line across the display screen in order to generate the displayed pattern. In order for a displayed raster scan image to continue to be displayed on the video screen, the image must be refreshed at periodic intervals. A common refresh rate for the cathode ray tube video display device is 1/60 of a second, since the refresh operation carried out at that speed is not noticable to the human user of the system. However, as the number of pixels displayed on a screen increases, in order to increase the resolution of the displayed image, more and more bits of information must be accessed from the bit-mapped memory in the refresh interval. If the bit-mapped memory has but a single input and output port, the percentage of time during which the data processing unit can access the bit-mapped memory decreases with the pixel size of the display if the refresh interval remains constant. In addition, the speed of the memory must increase, since more bits must be output during a fixed period of time.

Multiport random access memories have been developed which provide for high-speed output of data to the video display and also for increased accessability of the memory contents to the data processing device. The multiport memories accomplish this by having a first port for random access and update of the memory by the data processing unit of the computer system and a second port for serial output of the memory contents to the video display independent from and asynchronous with the first port, thereby allowing access to the memory contents during output of data to the video display terminal. Examples of multiport random access memories are described in U.S. Pat. No. 4,562,435 (issued Dec. 31, 1985), U.S. Pat. No. 4,639,890 (issued Jan. 27, 1987), and U.S. Pat. No. 4,636,986 (issued Jan. 13, 1987), all assigned to Texas Instruments Incorporated.

The multiport random access memory described in said U.S. Pat. No. 4,636,986 has four random access input/output terminals, and four serial access input/output terminals, so that the single memory device appears to have four memory arrays. This allows a single random access to read or write four data bits simultaneously, with a single address value, and also allows a by-four serial output for purposes of data communication to the video display. An external parallel-to-serial register can then receive the four serial output bits, and shift them to the video display at the display refresh rate; this allows the memory register to shift at one-fourth the rate of the video display, reducing the speed requirements of the semiconductor memory.

Other uses of the by-four organization provide for enhanced image display capabilities. For example, the by-four organization is useful in multi-color displays, since the four bits associated with each address can each constitute a memory "plane". As is well known in the art, a four plane system provides for the storage of a binary code representative of up to sixteen colors for each corresponding pixel of the video display. Another use of the four bits is to use one of the bits to represent text, and the other three bits for representing an eight bit color code for a graphical background; the by-four memory thus facilitates the overlaying of a text message on a graphics image. In such applications, it is useful to be able to modify data (via the random access port) in a subset of planes without modifying the data in the other planes, and without requiring the system to know the value of the data in the non-modified planes. Where a single memory device is used for each plane, the system can easily write to specific planes by controlling the write enable signals going to each chip. The above-referenced U.S. Pat. No. 4,636,986 describes a multiple input/output memory device having a write mask to selectively inhibit the write circuitry for subsets of the four inputs, so that non-selected planes of the video memory may remain unaltered during write operations to the selected planes.

The memory device described in said U.S. Pat. No. 4,636,986 is constructed so that the write mask information is presented to the device upon each occurrence of the row address strobe clock, i.e., at least as often as each change of row address. Advanced graphics systems now utilize extremely wide data buses, however, which necessitates the repeated update of the bit-mapped memory using the same mask information. The updating of a block of memory utilizing such a write mask to be loaded upon each row address strobe cycle requires not only the additional time necessary to set the write mask, but also requires external circuitry to store the write mask value for each repeated loading.

It is therefore an object of this invention to provide a multiple random access input memory capable of retaining a write mask value for multiple memory cycles.

It is another object of this invention to provide such a memory which also has an independent and asynchronous serial output.

It is another object of this invention to provide such a memory having the ability to load a register with the write mask information during a delayed write cycle.

it is another object of this invention to provide such a memory having the ability to retain the write mask information, so that a masked write cycle using a prior mask may be performed after an unmasked write operation.

It is another object of this invention to provide such a memory which contains a data register for storing information to be written to the memory, such as a color code, so that input data need not be provided for each write cycle.

It is yet another object of this invention to provide a dual-port memory which allows the addressing of a plurality of adjacent columns in a single cycle, so that repetitive writing to such adjacent columns can be done in a single memory cycle.

Other objects and advantages of the instant invention will become apparent to those of ordinary skill in the art having reference to the following specification, in combination with the drawings.

SUMMARY OF THE INVENTION

The invention may be incorporated into a random access memory having multiple random access inputs. A register is provided which is written to from the inputs in a special cycle, said register having a bit position for each of the inputs. The special cycle is enabled by way of an addition special function input, in combination with other signals presented to the device. The register stores a mask pattern indicating for which of the inputs the write operation is to be inhibited. Once the register is loaded, the execution of a sub sequent write cycle enables the write mask to block the write operation for those inputs for which write inhibition is desired. The register retains the mask information until rewritten during the special cycle, such special cycle occurring after a plurality of cycles of the row address strobe signal. An alternate mode for loading the register may also be incorporated, where the register is loaded similarly as a delayed write; such alternate mode allows loading of the register by microcomputers which multiplex address and data values on the same bus.

DETAILED DESCRIPTION OF THE PREFERRED EMBODIMENT

Figure 1:
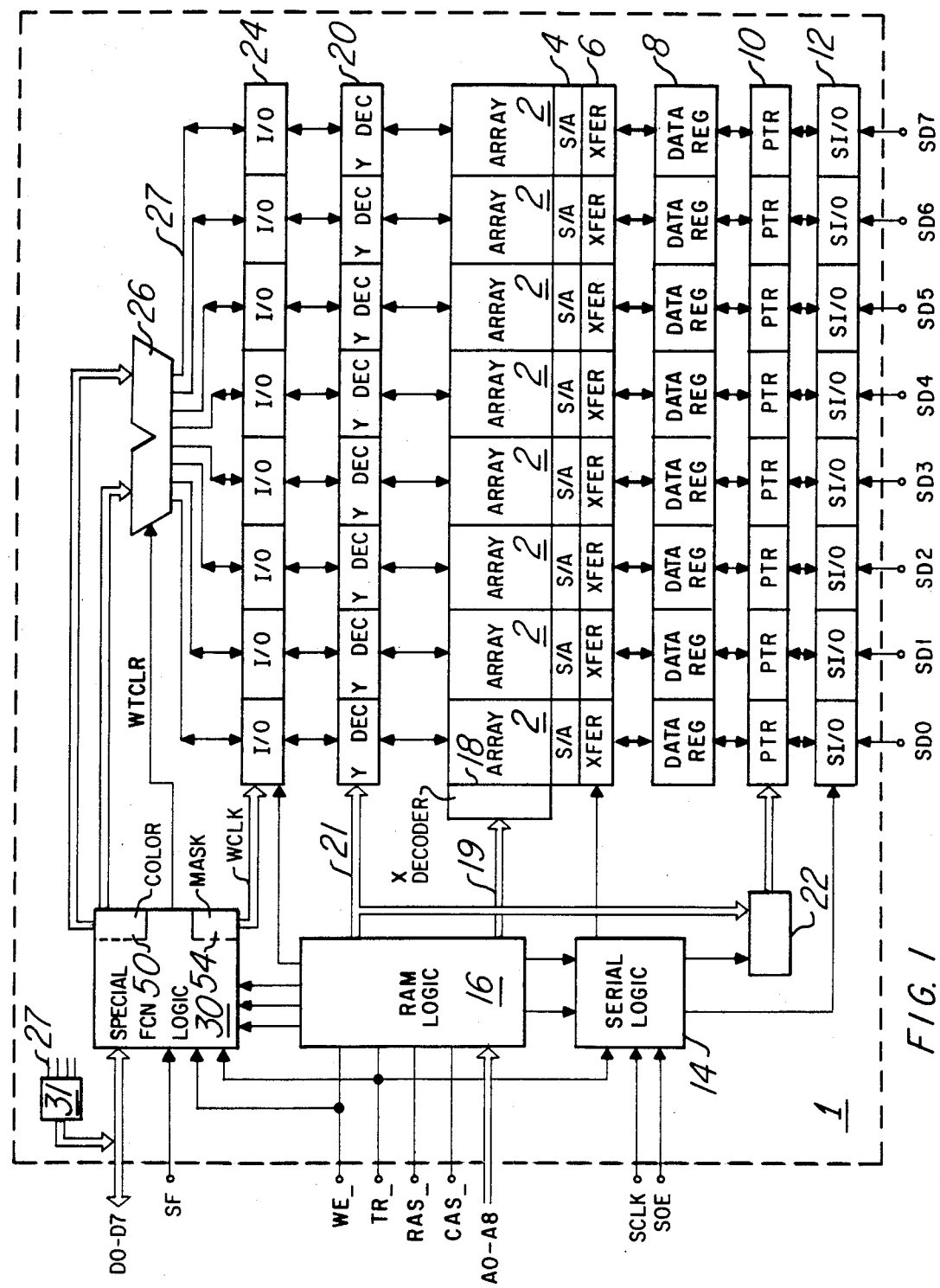
FIG. 1 illustrates a schematic block diagram of the preferred embodiment of a dual-port memory constructed according to the invention.

Referring now to FIG. 1, a functional block diagram of a dual port memory 1 constructed according to the instant invention, and containing an improved write mask feature, is illustrated. Similarly as the memory of said U.S. Pat. No. 4,636,986, incorporated herein by this reference, dual-port memory 1 receives address signals on lines A0 through A8, clock signals RAS__, CAS__ and SCLK, write enable signal WE__, transfer enable signal TR__, and serial output enable signal SOE. It should be noted that only a single column address strobe CAS__ is received and utilized by dual-port memory 1 as the write mask feature is included therein. Dual-port memory 1 has eight random access input/output lines D0 through D7, rather than the four such input/output terminals of the memory of said U.S. Pat. No. 4,636,986; the invention to be described herein will of course be applicable to either organization, or other organizations of a dual-port memory. Accordingly, dual-port memory 1 contains eight arrays 2, each of which in this embodiment contain 128 kbits of storage organized in 512 rows and 256 columns. Accordingly, dual-port memory 1 of FIG. 1 contains 1 Mbit storage capability. Associated with each of the arrays 2 are sense amplifier banks 4, containing 256 sense amplifiers as are well known in the art for the sensing, restoring and writing of data from and into the dynamic memory cells of the arrays 2.

Looking to the serial side of dual-port memory 1, transfer gates 6 are connected to each of the bit lines in the arrays 2, similarly as in the dual-port memory of said U.S. Pat. No. 4,636,986, for transferring data from the arrays 2 into data registers 8, or vice versa. In this example, data registers 8 are 256-bit registers, so 256 bits of data are transferred by each bank of transfer gates 6; i.e., in each transfer cycle, 2048 bits of data are transferred. Serial logic 14 receives the serial clock signal on line SCLK, a serial output enable on line SOE and the transfer signal on line TR__, as well as signals from RAM logic 16, so that the transfer of data may be effected at the proper time, as in the memory of said U.S. Pat. No. 4,636,986.

Toggle counter/decoder 22 contains a counter and a decoder for selection of a bit in each of data registers 8 to or from which serial input/output is to begin. Accordingly, toggle counter/decoder 22 receives the latched column address signal from RAM logic 16 on lines 21 which, as for the memory of said U.S. Pat. No. 4,636,986, selects the serial position from which serial input or output is to begin. Serial logic 14 controls toggle counter/decoder 22 to load the latched column address value in a transfer cycle, as above, and also provides a signal to toggle counter/decoder 22 for each cycle of the clock signal on line SCLK so that the value of the counter in toggle counter/decoder 22 is incremented for each serial cycle. Toggle counter/decoder 22 provides the decoded value stored in its counter to each of pointers 10, one such pointer 10 associated with each of the data registers 8. The contents of data registers 8 are not shifted therewithin in each serial cycle as in the memory of said U.S. Pat. No. 4,636,986, but pointer 10 instead points to a bit therewithin, with the position incrementing with each cycle of the clock signal on line SCLK incrementing the contents of the counter in toggle counter/decoder 22. The contents of the bit in each of data registers 8 which is pointed to by the associated one of pointer 10 is connected for input and output purposes to the associated one of serial input/output buffers 12, one of said serial input/output buffers being associated with each of the eight arrays 2 and data registers 8. Serial input/output buffers 12 communicate data between the associated serial input/output terminal SD0 through SD7 and the bit of its associated data register 8 which is pointed to by pointer 10. The signal on line SOE, as before, indicates to serial logic 14 whether the serial operation is a write or a read operation, and serial logic 14 controls the serial input/output buffers 12 accordingly. Serial input and output therefore occurs functionally in a fashion similar as that for the memory of said U.S. Pat. No. 4,636,986 for eight serial input/outputs, except that the serial register function is accomplished by a non-shifting data register 8 to which a bit therewithin is selected in an incrementing manner.

On the random access side, RAM logic 16 performs the address latching and decoding as performed in the memory of said U.S. Pat. No. 4,636,986, and therefore receives the row address strobe and column address strobe signals RAS__ and CAS__, respectively, and address lines A0 through A8. The row address value appearing on address lines A0 through A8 are latched by the row address strobe signal RAS__, and are communicated to X decoder 18 via lines 19, so that X decoder 18 can select a row in each of the arrays 2 responsive to the latched row address value on lines 19. Similarly, the column address value appearing on address lines A0 through A7 (the column address signal on line A8 being unnecessary to select one of 256 columns) are latched by RAM logic 16 responsive to column address strobe signal CAS__, and the latched column address value is communicated from RAM logic 16 to Y decoders 20 by way of lines 21, each of the eight arrays 2 having a Y decoder 20 associated therewith. Each of the Y decoders 20 are therefore operable to connect the desired bit line within its associated array 2 and which is corresponding to the latched column address value to its associated input/output buffer 24.

In addition to functions described in said U.S. Pat. No. 4,636,986, dual-port memory 1 has additional control over the random access data input function, such additional control performed by special function logic 30. Each of the eight input/output buffers 24 are connected to the data terminals D0 through D7 by way of multiplexer 26. For purposes of random access read, the output of input/output buffers 24 are received by output drive circuitry 31 and thereby communicated to the terminals of lines D0 through D7. Output drive circuitry 31 is constructed in any one of a number of well known configurations, and is enabled from the external signal on line TR__ under the control of RAM logic 16. For purposes of random access write, of course, output drive circuitry 31 will be disabled by RAM logic 16 to prevent a data conflict.

During a write cycle, line WTCLR from special function logic 30 controls multiplexer 26 to select either the data value appearing at data terminals D0 through D7 or the contents of a color register 32 within special function logic 30 to input/output buffers 24 via lines 27, depending upon the function selected by the user. Special function logic 30 is also operable to control the write mask feature similar to that described above for the memory of said U.S. Pat. No. 4,636,986; special function logic 30 is operable, however, to store the value of the write mask in a write mask register 54 so that the write mask value can operate for a plurality of cycles, and so that the write mask value may be recalled many cycles after it is initially loaded, and after intervening cycles of non-masked random access writes. The contents of write mask register 54, or a non-masked write signal, as desired, are applied by special function logic 30 to input/output buffers 24 by way of lines WCLK, as will be described hereinbelow.

Figure 2:
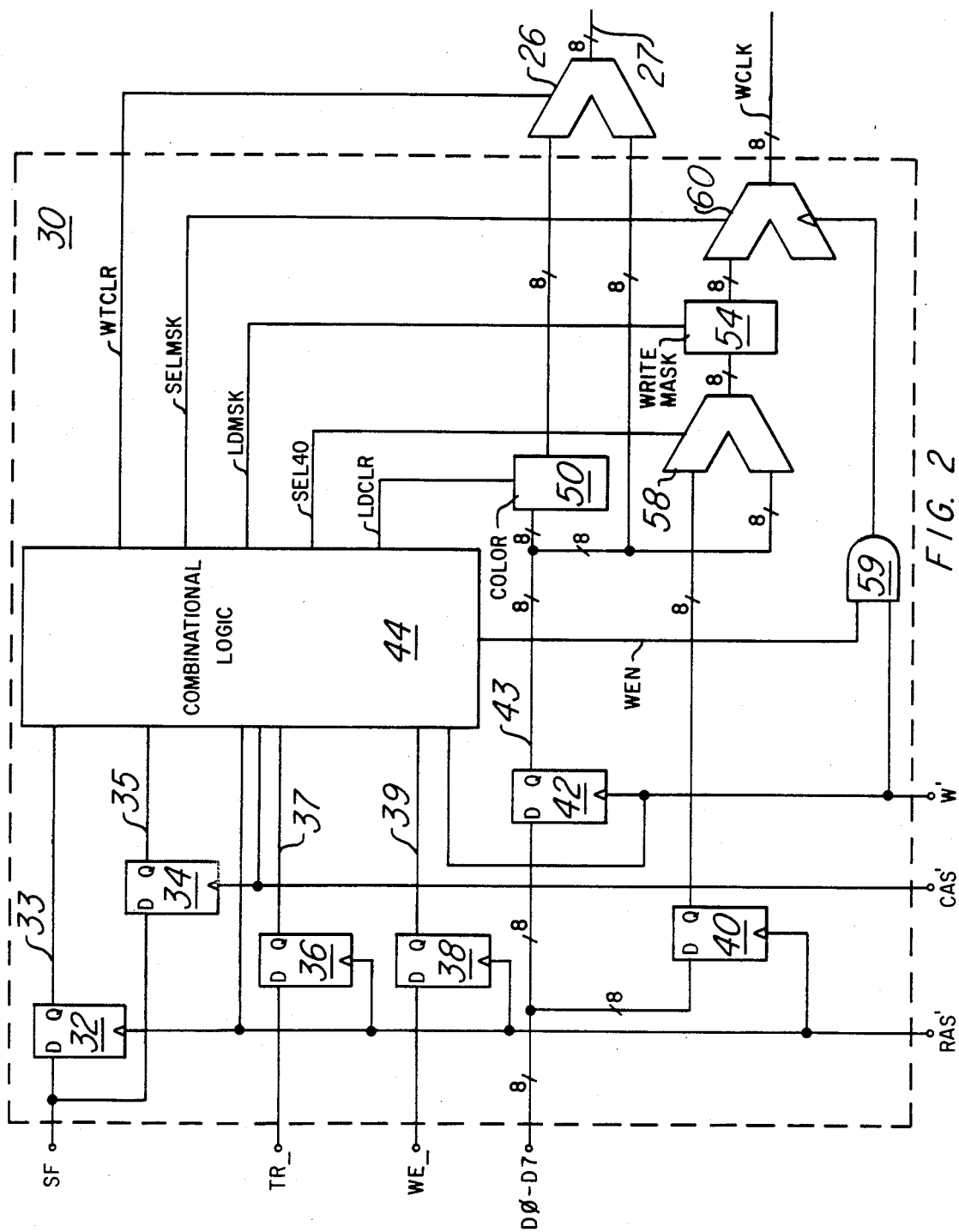
FIG. 2 illustrates a schematic block diagram of the special function logic of the dual-port memory of FIG. 1.

Referring now to FIG. 2, the construction and operation of special function logic 30 will be explained in detail. Special function logic 30 contains latches for storing the value of the various inputs thereto in conjuction with each of the row address strobe RAS__ and column address strobe CAS__ signals making high-to-low transitions, in a similar manner as the row and column addresses on address lines A0 through A8 are latched. Line SF, upon which the special function signal is presented from external to dual-port memory 1, is connected to the D-input of D-type latches 32 and 34. The clock input of latch 32 is clock signal RAS' which is a delayed clock pulse generated by RAM logic 16 from row address strobe signal RAS__, and the clock input of latch 34 is clock signal CAS' which is similarly a delayed clock pulse generated by RAM logic 16 from column address strobe signal CAS__. Special function logic 30 further contains latch 36 which receives at its D input line TR__ to receives the external transfer signal, and receives at its clock input the clock signal RAS'. Latch 38 receives the external write enable signal on line WE__, and also is clocked by clock signal RAS'.

The data input signals D0 through D7 are also latched relative to row address strobe RAS__, similarly as the signals discussed above, by latch 40 within special function logic 30. Latch 40 thus consists of eight latch bits, each of which is clocked by RAS', for the storage of the eight data signals from the eight data lines D0 through D7. The output of latch 40 is connected to one input of a multiplexer 58, which has its output connected to the input of an eight bit write mask register 54, the contents of write mask register 54 corresponding to which of the eight input/output buffers 24 will be enabled for a random access write operation. The output of write mask register 54 is connected to a first input of a multiplexer 60, which has its other input connected to power supply $V_{dd}$; it is of course understood that each of the inputs to multiplexer 60 consist of eight parallel bits, with multiplexer 60 selecting between the eight bit output of write mask register 54 or an eight bit value of all "1" generated by $V_{dd}$. Multiplexer 60 is controlled by line SELMSK from combinational logic 44. Line SELMSK is set by combinational logic 44 to a high logic level when the contents of write mask register 54 are to generate the signals on the eight lines WCLKS, each of said lined WCLK associated with one of input/output buffers 24, with a high logic level on a line WCLK causing its associated input/output buffer 24 to write the value on its one of lines 27 to the selected memory location in its array 2. Line SELMSK from combinational logic 44 being at a low logic level causes multiplexer 60 to apply power supply $V_{dd}$ to its output, signifying that all input/output buffers 24 are to perform a write operation, regardless of the contents of write mask register 54. It should be noted that multiplexer 60 is also controlled by the output of AND gate 59, which receives at its inputs clock signal W' and write enable signal WEN from combinational logic 44. The output of AND gate 59 gates the application of the selected input to multiplexer 58 to lines WCL, so that so that the enabling signals on lines WCLK are applied to input/output buffers 24 at the proper time in the cycle, and so that no such enabling signals are applied in read cycles.

The data input signals on lines D0 through D7 are also latched into eight bit latch 42, responsive to a clock signal W', which is generated by RAM logic 16 upon the later of CAS― and WE― going low, as discussed below. The output of latch 42 is connected to the input of an eight-bit color register 50, is connected to one input of data multiplexer 26, and is connected to the second input of multiplexer 58. The output of color register 50 is connected to the other input of data multiplexer 26. Color register 50 is loaded with the output of latch 42 upon combinational logic 44 generating a high logic level on line LDCLR, in order to store a predetermined data pattern to be presented to the eight input-/output buffers 24 during a subsequent write cycle in which the color register is selected as the data source. As is evident from FIGS. 1 and 2, data multiplexer 26 is operable to select between the contents of color register 50 or the output of latch 42 for application to input/output buffers 24 via lines 27, responsive to the control signal WTCLR from combinational logic 44 in special function logic 30; a high logic level on line WTCLR causes the contents of color register 50 to be applied to lines 27. As described above, output drive circuitry 31 applies the value of lines 27 to lines D0 through D7 in read cycles.

The output of latch 42 is also presented, as described above, to a second input of multiplexer 58, to provide an alternative method for loading write mask register 54. As will be explained below in greater detail, combinational logic 44, responsive to the user selecting one of the two operation modes for loading write mask register 54, will generate a high logic signal on line LDMSK. Depending upon whether the contents of latch 40 (storing the value of lines D0 through D7 latched by RAS―) or the contents of latch 42 (storing the value of lines D0 through D7 latched by WE―) are desired, combinational logic 44 will control the application of the selected latch contents to write mask register 54 by line SEL40, which selects the output of latch 40 when high and the output of latch 42 when low.

Figure 3A:
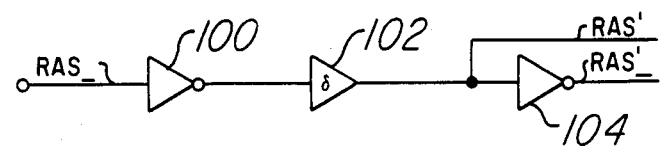
FIGS. 3a and 3b illustrate schematic diagrams of circuitry for generating clock signals used by the logic of FIG. 2.

Referring to FIG. 3a, the generation of clock signal RAS' is illustrated. The circuitry illustrated in FIG. 3a is resident within RAM logic 16 of FIG. 1. The row address strobe signal RAS― generated externally from dual-port memory 1 is inverted by inverter 100 and, after the desired delay through delay stage 102, generates the signal RAS' referred to above. An additional inversion by inverter 104 generates clock signal RAS―', which will be discussed below. It should be noted, of course, that the delays necessary, and indeed additional delayed versions of the signals RAS' and RAS―' are easily generated by those of ordinary skill in the art for use throughout dual-port memory 1 for a multitude of control functions. The signals CAS' and CAS―' may of course be generated within RAM logic 16 in a similar fashion, or by any of a number of methods well known by those of ordinary skill in the art.

Figure 3B:
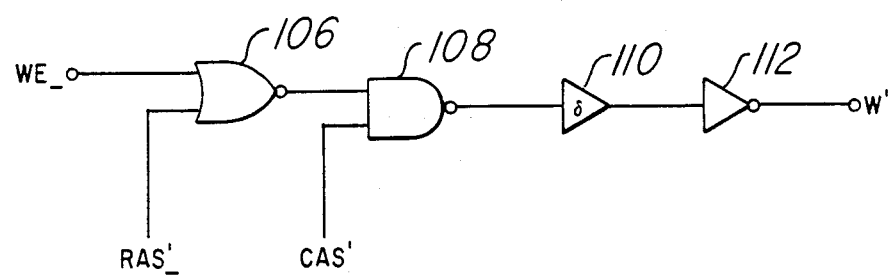

FIG. 3b illustrates the generation of the clock signal W' by RAM logic 16, such clock signal W' used in the circuit of FIG. 2. Line WE― receives the externally generated write enable signal, which is gated by way of NOR gate 106 having its other input connected to line RAS―'. The output of NOR gate 106, which is at a high level only when the write enable signal WE― occurs during a RAS― active period, is connected to a first input of NAND gate 108, which has its other input connected to line CAS―. As described above, the clock signal on line CAS' is a delayed and inverted version of column address strobe signal CAS―. The output of NAND gate 108 is at a low logic level upon both the output of NOR gate 106 and signal CAS' being at a high logic level; i.e., upon the later to occur of WE― and CAS―. By way of the desired delay by delay stage 110 and inversion by inverter 112, the clock signal W' utilized by the circuit of FIG. 2 is generated.

As generally discussed above, combinational logic 44 generates various control signals responsive to the stored state of latches 32, 34, 36 and 38, as presented on lines 33, 35, 37 and 39, respectively. These control signals control dual-port memory 1 to execute the operations of its various modes. Table 1 is a truth table for the various special modes of dual-port memory 1, certain of which will be further explained in detail hereinbelow.

TABLE 1

| RAS― transition | | | CAS― transition | Function |
|---|---|---|---|---|
| TR― | WE― | SF | SF | |
| 0 | 0 | 0 | X | Register-memory xfer |
| 0 | 1 | 0 | X | Memory-register xfer |
| 1 | 0 | 0 | 0 | Load write mask on RAS―; write data to array |
| 1 | 0 | 0 | 1 | Load write mask on RAS―; write color register to array |
| 1 | 0 | 1 | 0 | Use old write mask; write data to array |
| 1 | 0 | 1 | 1 | Use old write mask; write color register to array |
| 1 | 1 | 1 | 0 | Load write mask on WE― |
| 1 | 1 | 1 | 1 | Load color reg. on WE― |
| 1 | 1 | 0 | 1 | Disable write mask; write color register to array |
| 1 | 1 | 0 | 0 | Disable write mask; normal read/write |

As discussed above, control signal WTCLR is the signal generated by combinational logic 44 to cause data multiplexer 26 to select between the contents of color register 50 and the output of latch 42 for application to the input/output buffers 24. Control signal LDCLR is a signal generated by combinational logic 44 to cause color register 50 to be loaded with the contents of latch 42. Control signal LDMSK is a signal generated by combinational logic 44 to write mask register 54, to cause write mask register 54 to be loaded with either the contents of latch 42 or the contents of latch 40, depending upon the state of SEL40 which controls the operation of multiplexer 58. The application of the contents of write mask register 54 to lines WCLK is enabled depending upon the logic state on line SELMSK from combinational logic 44. Accordingly, combinational logic 44 is constructed of such logic necessary to generate the appropriate control signals responsive to the inputs presented thereto, and as will be described with reference to FIG. 4.

Combinational logic 44 receives the outputs of latches 32, 34, 36 and 38 on lines 33, 35, 37, and 39, respectively, as well as clock signals RAS' and W' described above. The construction and operation of combinational logic 44 will be described herein as it enables each of the special functions referred to above in Table 1.

As described above, write mask register 54 may be loaded from either the contents of latch 40 or the contents of latch 42. Since latch 42 is loaded responsive to the clock signal W', occurring upon the later of CAS― and WE―, not only can write mask register 54 be loaded in different ways, but write mask register 54 can also be loaded at different times in a cycle, allowing increased flexibility for the user of dual-port memory 1.

Figure 5A:
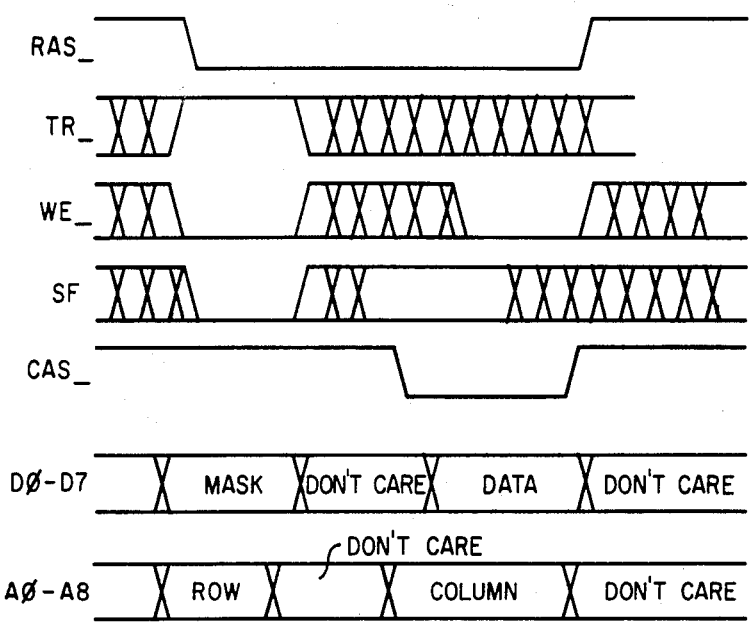
FIG. 5a illustrates a timing diagram of a memory cycle for loading the write mask register during the early portion thereof.

Referring to FIG. 5a, a timing diagram for the loading of write mask register from latch 40, i.e., during the first portion of the cycle, is illustrated. Table 1 indicates that write mask register 54 is loaded early when lines WE— and SF are at a low logic level, and line TR— at a high logic level, at the time that RAS— makes its high-to-low transition, as shown in FIG. 5a. At this time, the value on data lines D0 through D7 is loaded into latch 40 (responsive to clock signal RAS'), and the values on lines SF, TR—, and WE— are latched into latches 32, 36 and 38, respectively. The outputs of latches 32, 36 and 38 on lines 33, 37 and 39, respectively, are connected to the inputs of NAND gate 118 (lines 33 and 39 inverted by inverters 114 and 116). Accordingly, the output of NAND gate 118 will go to a low level upon the latched states of lines WE— and SF at a low level and the latched state of TR— being at a high level. This presents a logic low to one input of NOR gate 120, which has its other input controlled by clock signal RAS—, delayed as desired by inverting delay stage 122 to allow the operation of the latches and logic to occur; upon the low-to-high transition of delayed clock signal RAS', the output of NOR gate 120 will go to a high level, generating a high level on line SEL40 to multiplexer 58 of FIG. 2, indicating that the output of latch 40 is to be selected. Line SEL40 is also connected to one input of OR gate 124, to generate a high level on line LDMSK. Line LDMSK is connected to write mask register 54, and upon making a low-to-high transition indicates that write mask register 54 is to be loaded with the value of the output of multiplexer 58 which, in the described case, is the contents of latch 40. By this operation, write mask register 54 is loaded during the first part of the memory cycle.

After the values of lines TR—, WE— and SF are latched into their respective latches upon RAS— going low, lines TR—, WE— and SF are "don't cares" for purposes of the loading of write mask register 54 and can go to another logic level. Subsequent to the loading of write mask register 54, however, either a read or a write cycle may be performed by dual-port memory 1 depending upon the values placed on lines WE— and TR— (line TR—, as in the memory of said U.S. Pat. No. 4,636,986, serving as a random access output enable). FIG. 5a illustrates the more likely event of a write cycle occurring after the loading of write mask register 54 (the user's interest in performing a write operation is evidenced by the loading of write mask register 54). As shown in FIG. 5a, the row address value, i.e., the state of address lines A0 through A8 at the time of the RAS— transition, is received during the time that write mask register 54 is being loaded; the row address decoding and selection occurs by way of RAM logic 16 and X decoder 18 in the well known RAM manner. The column address value is presented on lines A0 through A7 in conjunction with the column address strobe signal CAS—, as illustrated in FIG. 5a.

Table 1 indicates that the value of line SF at the time of the CAS— transition determines whether the data received on lines D0 through D7 or the contents of color register 50 will be the data written to arrays 2. As shown in FIG. 2, latch 34 is loaded with the value of line SF responsive to clock signal CAS', which is a delayed and inverted signal relative to CAS—. Line 35 from the output of latch 34 is connected (after inversion by inverter 125) to one input of NOR gate 126. AND gate 127 receives at one of its inputs the output of NAND gate 118, which is at a low level as described above in the loading of write mask register 54; this of course forces a low logic level at the output of AND gate 127, which is presented to the other input of NOR gate 126. A high level will be generated at the output of NOR gate 126, and on line WTCLR, if the value of line SF at the time of the CAS— transition is at a "1" logic level, and a low level on line WTCLR will be generated in the event that line SF is at a "0" level at the CAS— transition. Line WTCLR is connected to the control input of data multiplexer 26 which applies the contents of color register 50 to lines 27 responsive to line WTCLR at a high logic level, and applies the contents of latch 42 to lines 27 when line WTCLR is at a low level. In this manner, combinational logic 44 is operable to select the data source for a write operation in the same memory cycle as a write mask register 54 load, said selection responsive to the value of line SF at the CAS— transition.

Lines 33, 37 and 39 are also connected to the inputs of AND gate 128, line 33 being inverted by inverter 114 prior thereto. Accordingly, since the value of the WE— line was at a logic "0" at the time of the RAS— transition, the output of AND gate 128 is at a logic "0". The output of AND gate 128 is connected, through inverter 130, to line SELMSK which is connected to the control input of multiplexer 60. A high logic level on line SELMSK, as in this cycle where write mask register 54 is loaded responsive to the RAS— transition, indicates that the contents of write mask register 54 are to be selected for generation of the signals on lines WCLK to input/output buffers 24. In addition, lines 33, 37 and 39 are also connected, with none inverted, to the inputs of AND gate 132; the output of AND gate 132 will also be at a logic low level, due to lines 33 and 39 being at logic low levels. The output of AND gate 132 is connected to inverter 134, which generates at its output the signal for line WEN connected to one input of AND gate 59 in FIG. 2. Accordingly, since the output of AND gate 132 is at a low level, line WEN is at a logic high level, enabling clock signal W' to gate, via multiplexer 60, the contents of write mask register 54 to lines WCLK. As described above, the signals on lines WCLK are the write clocks to input/output buffers 24, which will effect the writing of the data on lines 27 to arrays 2, with those input/output buffers associated with stored "0" in write mask register 54 not performing a write operation. Therefore, upon the later of WE— and CAS— making a high-to-low transition while the other is active low (i.e., the transition of WE— to a low level and back to a high level in conjunction with RAS— transition does not generate the W' clock signal), a clock signal will be generated on line W', which will appear to gate the selected input of multiplexer 60 to lines WCLK to effect the write operation by input/output buffers 24.

Figure 6:
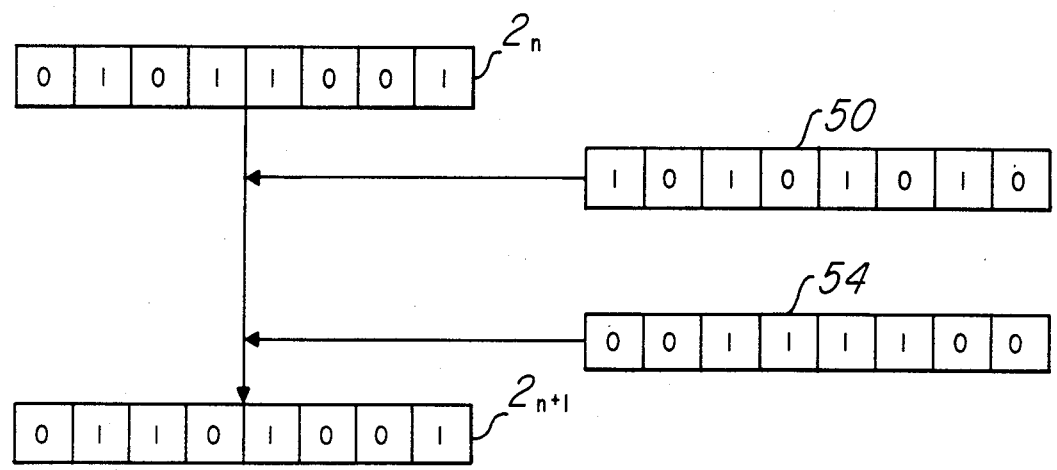
FIG. 6 is a register level illustration of a masked write operation.

FIG. 6 illustrates the masked write operation on a register-level diagram. An example of the eight bits of a memory location prior to the masked write operation is shown therein as $2_n$, with each of the eight bits corresponding to the addressed location within each of the arrays 2 of dual-port memory 1. The data source containing the data to be written in this example is color register 50, an example of the contents of which illustrated in FIG. 6 as $10101010_2$. The contents of write mask register 54 are illustrated in FIG. 6 as writing only to the four center bits, i.e., the third through sixth least significant bits of the eight bit memory location; conversely, the write operation is "masked" relative to the two most and two least significant bits of memory location $2_n$. Upon performing the write cycle described above, where the contents of color register 50 is written in a masked write, the updated contents of the addressed memory location is shown in FIG. 6 as $2_{n+1}$. It should be apparent that only the center four bits are written with the contents of color register 50, with the two most and two least significant bits remaining the same as prior to the write operation.

Figure 5B:
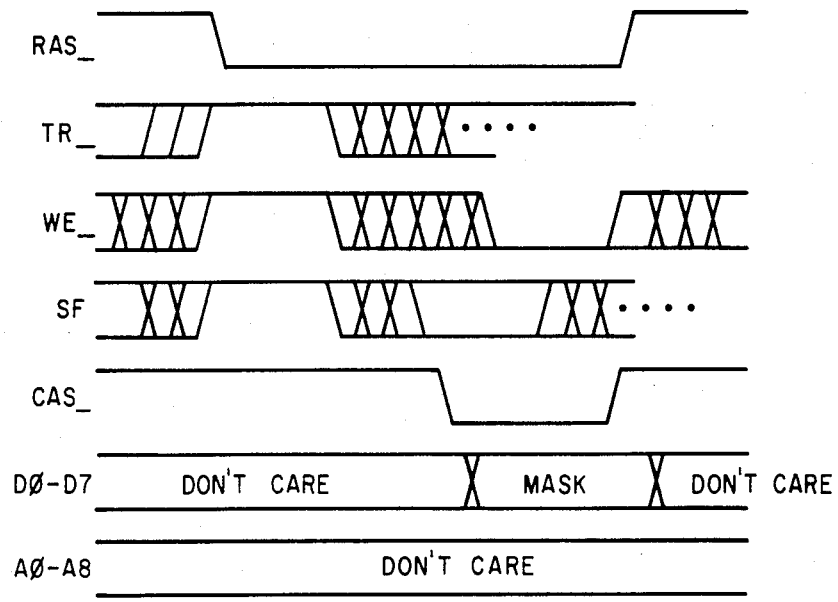
FIG. 5b illustrates a timing diagram of a memory cycle for loading either the write mask register or the color register during a latter portion thereof.

As mentioned above, dual-port memory 1 can load write mask register 54 during the latter portion of the memory cycle, by way of latch 42 clocked by clock signal W'. FIG. 5b illustrates a timing cycle for the loading of write mask register in the latter portion of the memory cycle. Lines 33, 37 and 39 are, as discussed above, connected to the inputs of AND gate 132 without any of the three signals being inverted, so that the output of AND gate 132 is at a high level when all three are at a high level. This corresponds to Table 1, where the late loading of write mask register 54 is enabled by lines SF, WE— and TR— being at a high logic level at the RAS— transition. The high level at the output of AND gate 132 presents, via inverter 134, a low level on line WEN which disables any write clock signals from being presented on lines WCLK, thereby preventing a write operation to arrays 2. The output of AND gate 132 is connected to one input of NAND gate 136, which has line W' connected to its other input; until the latter of WE— or CAS— (after the RAS— transition), the output of NAND gate 136 will remain at a high logic level. NOR gate 138 receives the output of NAND gate 136 at one input, and receives the output of latch 34 on line 35 at its other input; as stated above, latch 34 stores the value of line SF at the time of the CAS— transition. Table 1 indicates that write mask register 54 is loaded when line SF is at a "0" level at the CAS— transition, when lines SF, WE— and TR— are all high at the RAS— transition. Accordingly, for load of write mask register 54, line 35 will be at a low level responsive to clock signal CAS' latching the low level on line SF into latch 34.

The loading of write mask register 54 is completed upon the later of WE— or CAS— (after the RAS— transition—). The example illustrated in FIG. 5b shows WE— making its transition after CAS', and the following description will use this example. Referring back to FIG. 2, latch 42 will be loaded with the value on lines D0 through D7 upon clock signal W', which is generated upon the later of WE— and CAS— making a high-to-low transition (while the other is active; see FIG. 3b). FIG. 5b illustrates the presentation of the contents of write mask register 54 as "MASK" on data lines D0 through D7 at the time of WE— going low. In addition, clock signal W' causes the output of NAND gate 136 to go to a low level, thereby generating a high level at the output of NOR gate 138. This generates, via OR gate 124, a high level on line LDMSK which causes a load of write mask register 54 with the output of multiplexer 60. Since the output of NAND gate 118 is at a "1" level (line 39 being at a high level), line SEL40 will be at a low level by operation of NOR gate 120. As described above, a low level on line SEL40 will control multiplexer 60 to select the contents of latch 42 for application to write mask register 54 upon the LDMSK signal generated above; latch 42 is storing the value of data lines D0 through D7 loaded thereinto at this time. In this manner, combinational logic 44 effects the late load of write mask register 54 by way of the timing of FIG. 5b, with line SF at a low level at the CAS— transition.

Color register 50 is loaded in the same manner as write mask register 54 in the late-load mode, only with line SF at a high level at the CAS— transition as indicated in Table 1. This is effected by NOR gate 140 which receives the output of NAND gate 136 discussed above, and which receives line 35 after inversion by inverter 125. A high logic level on line SF at the CAS— transition results in a low level at one input of NOR gate 140. Upon the later of WE— and CAS— making a high-to-low transition, the output of NAND gate 136 goes to a low level as described above, driving the output of NOR gate 140 to a high level. The output of NOR gate 140 is line LDCLR which is connected to color register 50 and which, at a high level, causes color register 50 to be loaded with the contents of latch 42. Latch 42, as described above, is loaded with the value of data lines D0 through D7 responsive to clock signal W' (i.e., the value "CONTENTS" of FIG. 5b).

It should be noted that for either the loading of color register 50 or of the late loading of write mask register 54 random access of dual-port memory 1 is inhibited. As illustrated in FIG. 5b, this causes the values of the addresses on lines A0 through A8 to be "don't cares" at both the RAS— and CAS— transitions.

It is useful, as discussed above in the "Background of the Invention", to be able to use the contents of write mask register 54 in a multiple of memory cycles, as well as to be able to perform unmasked write operations without requiring the reloading of the write mask information prior to performing a subsequent masked write operation. Accordingly, Table 1 indicates that certain modes of operation are available to repeatedly use the contents of write mask register, as well as to perform unmasked write operations while retaining the write mask information in write mask register 54. Special function logic 30, and combinational logic 44 therewithin, are designed to accomplish these functions.

Figure 4:
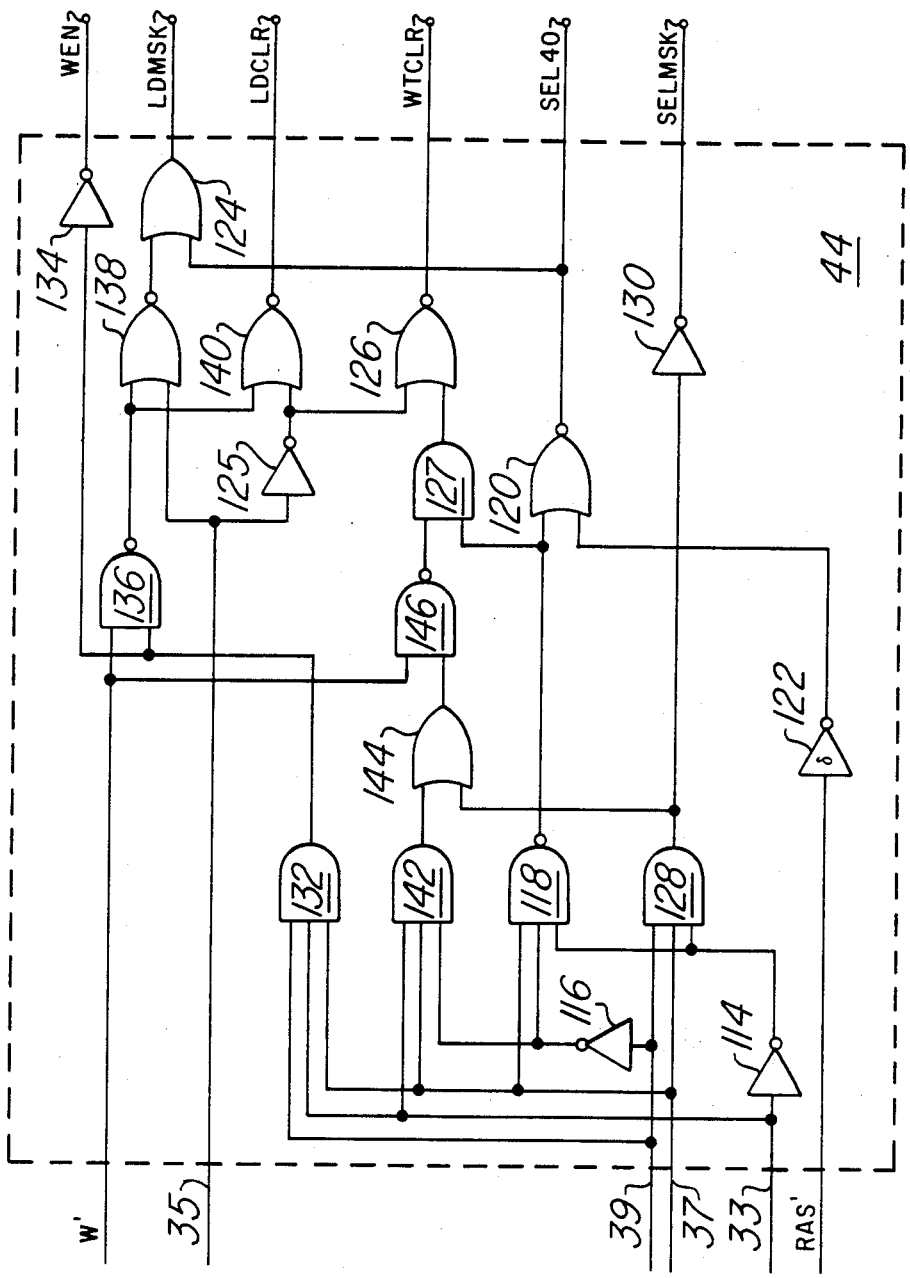
FIG. 4 illustrates a schematic diagram of combinational logic within the special function logic of FIG. 2.
Figure 5C:
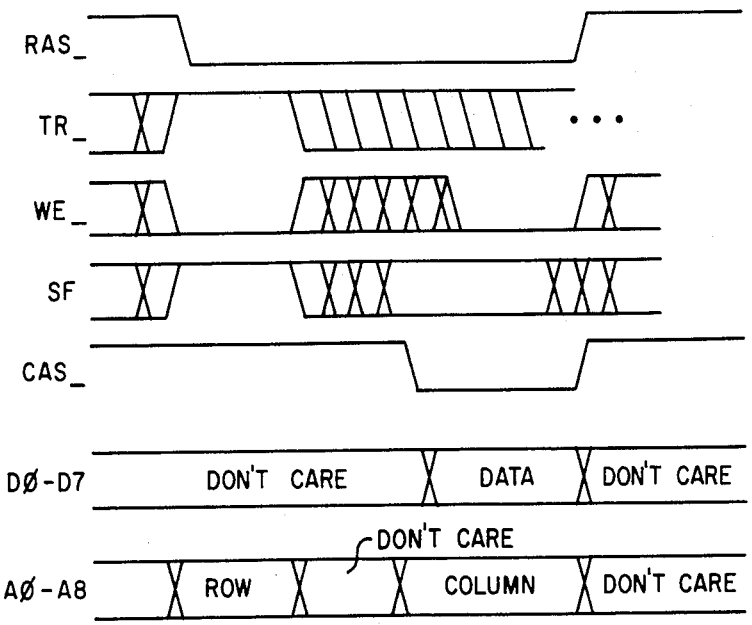
FIG. 5c illustrates a timing diagram of a memory write cycle utilizing the contents of the write mask register loaded in a previous cycle.

FIG. 5c is a timing diagram illustrating the operation of a masked write cycle, without the reloading of write mask information, i.e., utilizing the prior contents of write mask register 54. Upon the RAS— transition, lines TR— and SF are at a high logic level, while line WE— is at a low logic level. As before, latches 32, 36, and 38 latch in these values upon clock signal RAS', for receipt by combinational logic 44. Referring to FIGS. 2 and 4, since the output of AND gate 128 is at a logic low level for this combination, line SELMSK will be at a high level, so that the contents of write mask register 54 will be selected for application to lines WCLK upon the output of AND gate 59 going to a high level. Since this combination of lines TR—, SF and WE— on the RAS— transition causes the output of AND gate 132 to be at a low level, so that line WEN will be at a high level, which allows the later of WE— and CAS— going low to apply the output of multiplexer 60, i.e., the contents of write mask register 54, to lines WCLK.

For the above-described combination of lines TR—, SF and WE— on the RAS— transition, however, the contents of write mask register 54 applied in this cycle will be unchanged from its prior state. The reloading of write mask register 54 is precluded by combinational logic 44, since the low level output of AND gate 132 also causes the output of NAND gate 136 to be at a high level and, in turn, the output of NOR gate 138 to be at a low level. Since the output of NAND gate 118 is at a high level for the above combination of lines TR—, SF and WE— on the RAS— transition shown in FIG. 5c, a low level is forced at the output of NOR gate 120. Therefore, both inputs to OR gate 124 are low, which forces a low level on line LDMSK, precluding write mask register 54 from being reloaded. The prior contents of write mask register 54 are thereby retained, and are utilized in the write cycle as selected by line SELMSK described above.

Depending upon the state of line SF upon the CAS— transition, the data applied to lines 27 for the masked write operation of can either be the contents of color register 50, or the value of data lines D0 through D7 latched by latch 42 upon clock signal W'. Combustion logic 44 illustrated in FIG. 4 allows this selection according to the truth table of Table 1, by way of AND gate 142 having its three inputs connected to lines 33, 37 and 39, with line 39 inverted by inverter 116. The output of AND gate 142 thus will have its output at a high logic level responsive to the combination upon the RAS— transition of lines TR— and SF at a high logic level and while line WE— at a low logic level. The output of AND gate 142 is connected to a first input of OR gate 144, driving the output of OR gate 144 when it is at a high level. The output of OR gate 144 is connected to a first input of NAND gate 146, which has its other input connected to clock signal W' described above, and its output connected to an input of AND gate 127. NAND gate 146 therefore has its output driven low when the output of AND gate 142 is at a high level upon the low-to-high transition of clock signal W'. The low level of the output of NAND gate 146 forces a low level at the output of AND gate 127 which presents a low level at an input of NOR gate 126 as discussed above. Similarly as described above for the cycle of FIG. 5a, line WTCLR is driven high or low by operation of line 35 from latch 34, which stores the value of line SF upon the CAS— transition, thereby controlling data multiplexer 26 to select the contents of color register 50 for application to lines 27 to input/output buffers 24, or to select the value of data lines D0 through D7. FIG. 5c illustrates the timing required for data lines D0 through D7 to present valid data ("DATA") in the event that such input data is the desired data source. As described above, latch 42 latches the input data upon clock signal W', with the output of latch 42 applied to one input of data multiplexer 26, if desired by the user.

Figure 5D:
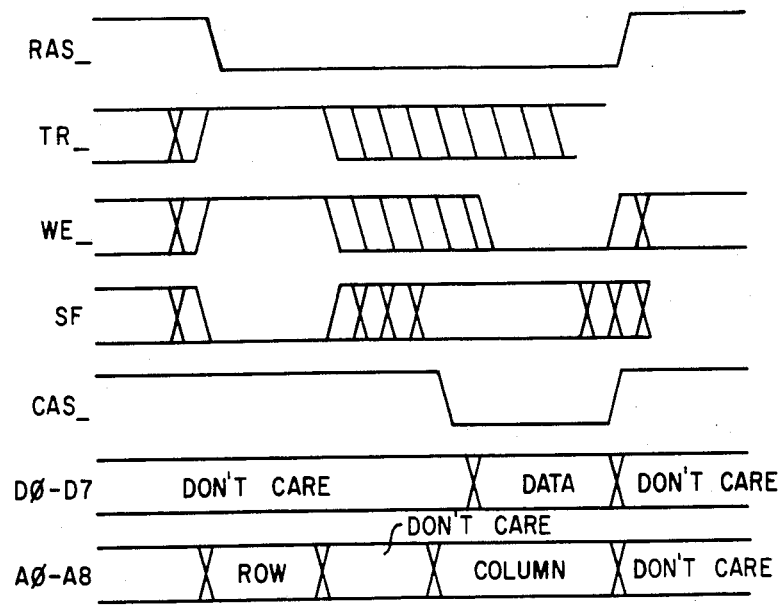
FIG. 5d illustrates a timing diagram of a memory write cycle ignoring the contents of the write mask register without destroying its contents.

The contents of write mask register 54 may be ignored for a write operation, yet retained for subsequent masked write operations, by a special cycle effected by special function logic 30, and combinational logic 44 therewithin. The timing of an example of such a cycle is illustrated in FIG. 5d. Upon the RAS— transition, as stated in Table 1, lines TR— and WE— are at a high logic level while line SF is at a low level; as before, these values are latched into latches 36, 38 and 32, respectively, by clock signal RAS'. This combination, presented on lines 37, 39 and 33 (line 33 inerted by inverter 114) causes the output of AND gate 128 to go to a "1" logic level, placing a low logic level on line SELMSK so as to cause multiplexer 60 to select $V_{dd}$ for application to lines WCLK at the proper time, ignoring the contents of write mask register 54. Since the contents of latch 32, corresponding to the state of line SF low on the RAS— transition, is at a low level, the output of AND gate 132 is also low, placing a high level on line WEN so that clock signal W' will be passed through to multiplexer 60 for generation of the high logic levels on all of lines WCLK, due to line SELMSK being low. As for the prior write cycles, FIG. 5d illustrates that line WE— is driven low after the CAS— transition, to effect the write operation via write signal W'.

Similarly as in the case of FIG. 5b, loading of write mask register 54 is precluded, since the outputs of AND gate 132 is low and the output of NAND gate 118 is high for the combination of lines TR— and WE— high with line SF low upon the RAS— transition. Since no new value is loaded into write mask register 54 (line LDMSK staying low), the prior value stored therein is retained. Accordingly, a subsequent cycle such as that illustrated in FIG. 5c will cause a masked write operation, using the write mask information retained in write mask register 54, without the need to reload the write mask information.

As discussed above relative to FIG. 5c, the state of line SF at the time of the CAS— transition will control whether the write cycle of FIG. 5d uses color register 50 as the data source (line SF being a "1") or uses the value of data lines D0 through D7 ("DATA" of FIG. 5d) as the data source. Combinational logic 44 effects this selection since the output of AND gate 128 is connected to a second input of OR gate 144, thereby having the same effect on the generation of the WTCLR signal by NOR gate 126 as the output of AND gate 142 discussed above relative to the cycle of FIG. 5c.

In the use of a dual-port memory such as dual-port memory 1 shown in FIG. 1 in a video system, often a number of successive memory locations may be written with identical data. For example, where dual-port memory 1 contains a bit-mapped representation of a graphics image, a large area of the displayed image may be filled with a certain color. Accordingly, it would be useful to write identical data to multiple locations in dual-port memory in single cycles.

Figure 7:
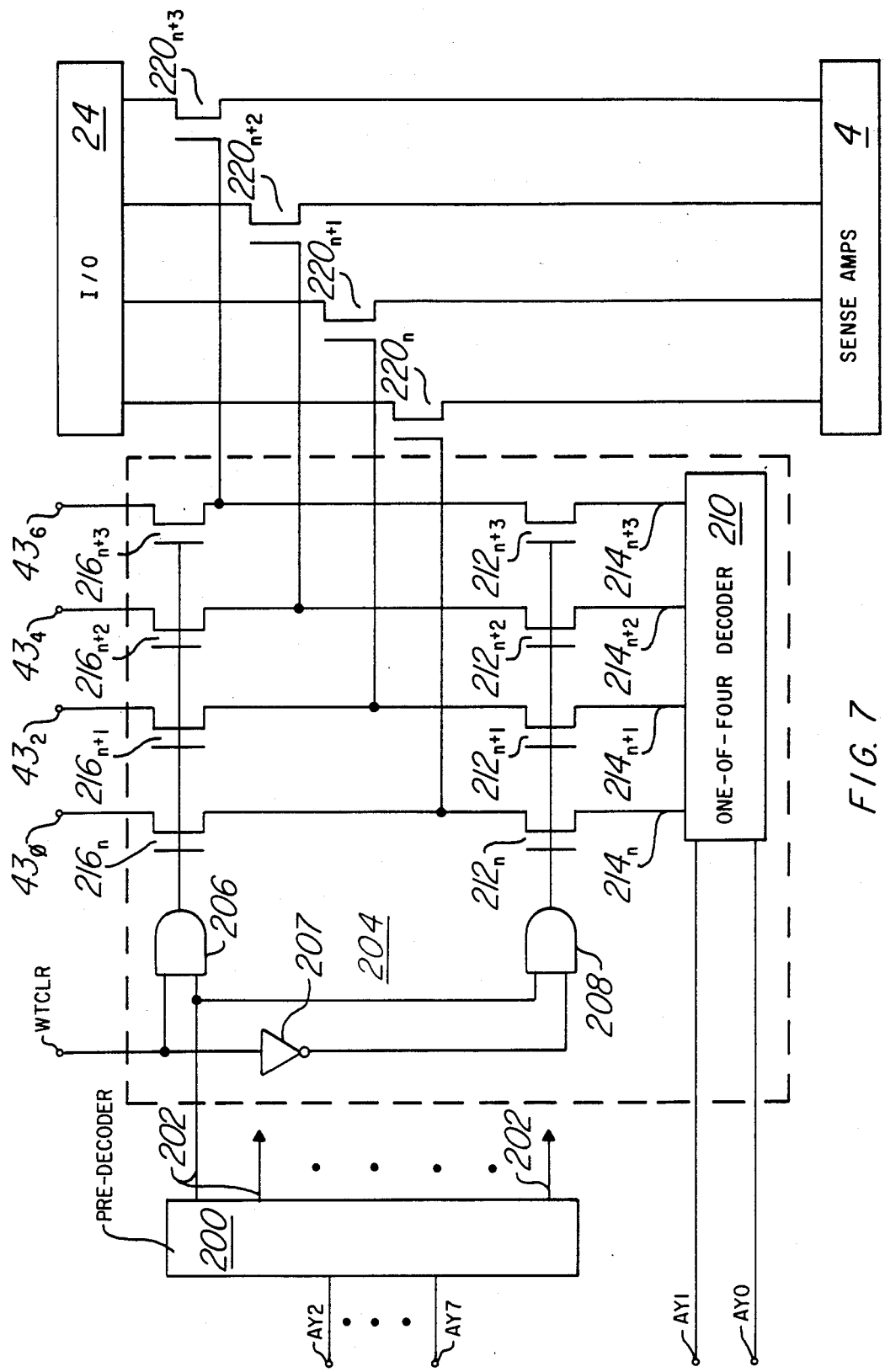
FIG. 7 is a schematic diagram of a column decoder which incorporates the addition of a block write feature to the memory of FIG. 1.

Referring now to FIG. 7, a block diagram of Y decoder 20 is illustrated which contains circuitry for performing the feature of addressing adjacent columns therewithin in a single cycle, hereinafter referred to as the "block write" feature. While the operation of dual-port memory 1 may be enhanced by the feature described hereinbelow relative to FIG. 7, it should be noted that dual-port memory described hereinabove is fully operable without the block write feature. It should be noted that FIG. 7 illustrates Y decoder 20 for a single array 2 in dual-port memory 1; of course, the circuitry illustrated in FIG. 7 will of course be associated with each of arrays 2 shown in FIG. 1. Y decoder 20, as described above, receives the latched values of the column address received on address lines A0 through A7; these latched column address lines are represented by lines AY0 through AY7 on FIG. 7. Of course, since only 256 columns are present in each of arrays 2, the value of address line A8 latched by the CAS— signal is not utilized in the column decoding operation. Pre-decoder 200 receives lines AY2 through AY7, and decodes these six bits into 64 output lines 202, one of which will be enabled by being at a high logic level. Each of output lines 202 thus represents the selection of a group of four columns in its associated array 2.

Associated with each group of four columns is column select circuit 204; only one column select circuit 204 is illustrated in FIG. 7, for the sake of simplicity. The associated output line 202 from pre-decoder 200 is connected to one input of AND gate 206, and to one input of AND gate 208, contained within each column select circuit 204. Line WTCLR from special function logic 30 is connected to the second input of AND 206; line WTCLR, inverted by inverter 207, is connected to the second input of AND gate 208. As described above, line WTCLR is generated when the contents of color register 50 are to be written into arrays 2; the feature described herein for addressing multiple columns within each of arrays 2 is enabled by the same signal. Also included within column select circuit 204 is one-of four decoder 210 which performs the actual decoding of the least significant column address bits on lines AY0 and AY1, in selecting the column within array 2 which is to be addressed in the random access mode. One-of-four decoder 210 drives four lines $214_n$ through $214_{n+3}$, depending upon the value of lines AY0 and AY1. Pass transistors $212_n$ through $212_{n+3}$ connect its corresponding line $214_n$ through $214_{n+3}$ to the gate of its corresponding transistor $220_n$ through $220_{n+3}$. The gates of each of pass transistors $212_n$ through $212_{n+3}$ are controlled by the output of AND gate 208. Accordingly, in the event that the block write feature is selected, i.e., line WTCLR is at a hgh logic level, the result of one-of-four decoder 210 will be ignored, even if the corresponding output line 202 is selecting the group of four columns associated therewith.

Column select circuit 204 further receives the even bits of the contents of latch 42, shown in FIG. 7 as lines $43_0$, $43_2$, $43_4$ and $43_6$. As described above, latch 42 stores the value of data input lines D0 through D7 received at the time of the later of the write enable signal on line WE_ or the column address signal on line CAS_ in each cycle. Each of lines $43_0$, $43_2$, $43_4$ and $43_6$ are connected to a pass transistor $216_n$ through $216_{n+3}$, which has its gate connected to the output of AND gate 206, and each of which is also connected to the gate of its corresponding transistor $220_n$ through $220_{n+3}$.

Transistors $220_n$ through $220_{n+3}$ connect the input/output buffer 24 associated with array 2 to the sense amplifier 4 associated with its column, in order to accomplish the write operation for the selected columns, in a manner well known in the art. For the normal operating mode where line WTCLR is not enabled, the output of AND gate 206 is at a logic low, disabling lines $43_0$, $43_2$, $43_4$ and $43_6$ from affecting the state of transistors $220_n$ through $220_{n+3}$. At the same time, the output of AND gate 208 for the group of four columns selected by pre-decoder 200 will be at a logic high level, allowing the result of one-of-four decoder 204 to control the connection of the associated input/output buffer 24 to the sense amplifier 4 for the selected column.

When the block write feature is selected by the state of lines WE_, SF and TR_ as shown in Table 1 for the enabling of line WTCLR by combinational logic 44, the output of AND gate 206 will be at a high level for the group of four columns which are selected by pre-decoder 200 responsive to lines AY2 through AY7. In this event, the state of lines $43_0$, $43_2$, $43_4$ and $43_6$ will determine which of transistors $220_n$ through $220_{n+3}$ will be conductive, and indeed allows the connection of up to all four of the columns in the associated group to be connected to its input/output buffer 24. The contents of the bit of color register 50 corresponding to the array 2 will then be written into the columns selected by the state of lines $43_0$, $43_2$, $43_4$ and $43_6$, from latch 42.

Figure 8:
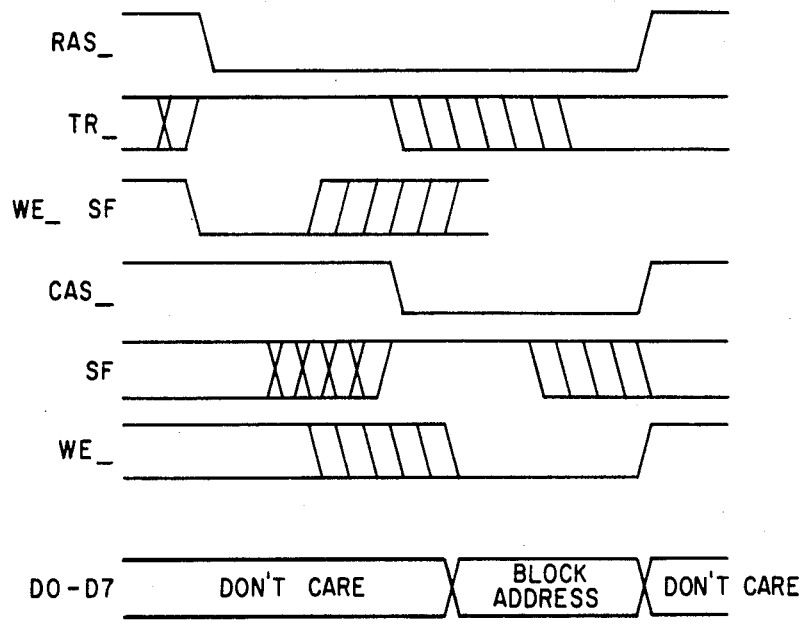
FIG. 8 is a timing diagram of the operation of a block write cycle, using the circuitry of FIG. 7.

Referring now to FIG. 8, a timing diagram is illustrated which illustrates the operation of the block write feature. As is evident from Table 1 above, the contents of color register 50 are written in write cycles when line TR_ is high at RAS_ going active with either line WE_ or line SF low at that time, in conjunction with line SF being high when column address signal CAS_ goes active. According to Table 1 and as illustrated in FIG. 8, the write operation of the color register (and, in this embodiment, the block write feature), requires at the time that row strobe signal RAS_ goes active in its low state, that line TR_ is high, and that the logical AND of WE_ and SF is low; at the time that column address strobe signal CAS_ goes active, line SF must be in its high state. With the block write mode thus enabled, the value of the even bits of the data input signal on lines D0 through D7 (i.e., lines D0, D2, D4 and D6) at the time of the later of CAS_ or WE_ going active designates the columns in the group of four which are to be written with the value of the color register 50 for the corresponding array 2. As explained above, all four of such columns may be addressable in this mode, providing the feature that four columns in each of the eight arrays 2 may be written in a single cycle.

Figure 9:
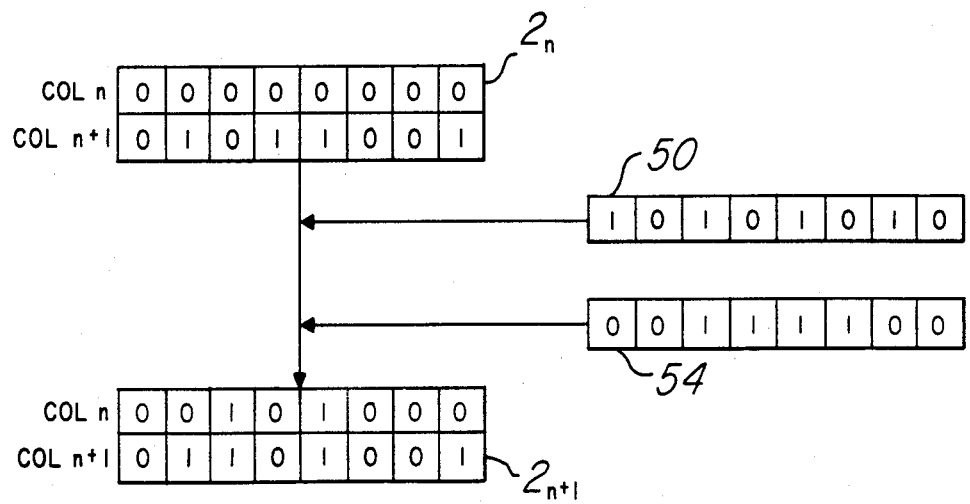
FIG. 9 is a register level illustration of the application of a color register and write mask register.

Referring again to Table 1, in the event that both line SF and line WE_ are low at the time RAS_ goes active, the masked write operation will be enabled along with the block write feature. In this way, the contents of color register 50 may be written to multiple columns (within a group of four), to only selected arrays. Referring to FIG. 9, a register level illustration of the application of the color register 50 and write mask register 54 is illustrated in modifying the contents of the memory locations in each of the arrays 2 associated with two columns $COL_n$ and $COL_{n+1}$. As described above, columns n and n+1 would be selected in the event that data lines D0 and D2 had a "1" logic level, and data lines D4 and D6 had a "0" logic level, at the time of write enable line WE_ going active after CAS_ is active in the timing of FIG. 8. As in the example of FIG. 6, only third through sixth least significant bits are written to with the contents of color register 50; with the block write feature explained above, however, this masked write operation takes place simultaneously in selected columns $COL_n$ and $COL_{n+1}$.

While the invention has been described in detail herein with reference to its preferred embodiment, it is to be understood that this description is by way of example only, and is not to be construed in a limiting sense. It is to be further understood that numerous changes in the details of the embodiment of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A memory device, comprising:
   a first input terminal for receiving data;
   a second input terminal for receiving data;
   a first plurality of addressable read/write memory cells, associated with said first input terminal;
   a second plurality of addressable read/write memory cells, associated with said second input terminal;
   address terminals for receiving an address signal;
   select means, connected to said address terminals, for selecting a memory cell in said first and said second plurality of memory cells responsive to said address signal;

a first writing means for writing the data received at said first input terminal to the selected memory cell in said first plurality of memory cells;

a second writing means for writing the data received at said second input terminal to the selected memory cell in said second plurality of memory cells;

a mask code register for storing a mask code;

mask means for selectively inhibiting said first and second writing means from writing the input data received by said first and second input terminals to said first and second pluralities of memory cells, respectively, responsive to said mask code;

a function control terminal; and mask enable means, connected to said mask means and to said function control terminal, for selectively enabling and disabling the mask means responsive to signals applied to said function control terminal;

wherein said mask code register retains said stored mask code after said mask enable means has been disabled.

2. The memory device of claim 1, further comprising:

function select logic, coupled to said function control terminal and to said mask code register, for loading said mask code register with data recieved at said first and second input terminals responsive to a mask code store signal received at said function control terminal.

3. The memory device of claim 2, further comprising:

a clock terminal; and an input latch, coupled to said first and second input terminals and to said clock terminal, for storing the logic states of said first and second input terminals responsive to a clock signal received at said clock terminal;

and wherein said function select logic loads said mask code register with the contents of said input latch responsive to a mask code store signal received at said function control terminal.

4. The memory device of claim 3, further comprising:

a function latch, coupled to said function control terminal and to said clock terminal, for storing the logic state of said function control terminal responsive to said clock signal;

wherein said function latch has an output connected to said function select logic, said mask code store signal being comprised of said function latch output being at a first logic state.

5. A memory device, comprising:

a first input terminal;

a second input terminal;

a first plurality of addressable read/write memory cells, arranged in rows and columns;

a second plurality of addressable read/write memory cells, arranged in rows and columns;

address terminals for receiving an address signal;

a row decoder, connected to said address terminals, for selecting a row of said first and second pluralities of memory cells corresponding to a row address signal received by said address terminals;

a column decoder, connected to said address terminals, for selecting a memory cell in said selected row in each of said first and second pluralities of memory cells corresponding to a column address received at said address terminals;

a mask code register for storing a mask code;

writing means, connected to said mask code register, for selectively writing data received at said first and second input terminals to the selected memory cells in said first and second pluralities of memory cells, respectively, according to said mask code;

function input means for receiving function control signals; and mask disable means, connected to said function input means, for disconnecting said mask code register from said writing means responsive to a non-mask write signal received by said function input means;

wherein said mask code register retains said stored mask code after being disconnected from said writing means by said mask disable means.

6. The memory device of claim 5, further comprising:

a row clock terminal for receiving a row clock signal;

a column clock terminal for receiving a column clock signal; and a write signal terminal, for receiving a write enable signal;

wherein said row decoder selects the row corresponding to the value of said address terminals at the time of said row clock signal;

wherein said column decoder selects the memory cells corresponding to the value at said address terminals at the time of said column clock signal;

and wherein said writing means is enabled by the write enable signal received by said write signal terminal.

7. The memory device of claim 6, further comprising:

a first input latch connected to said first and second input terminals, for storing the second of said first and second input terminals responsive to said row clock signal; and special function logic, connected to said function input means, to said first input latch and to said mask code register, for loading said mask code register with the value of said first and second input terminals responsive to a mask load signal received by said function input means.

8. The memory device of claim 7, further comprising:

write clock means, for generating a write clock signal responsive to said write enable signal; and a second input latch connected to said first and second input terminals, for storing the value of said first and second input terminals responsive to said write clock signal;

wherein said writing means couples the contents of said second input latch to the selected memory cells in said first and second pluralities of memory cells according to said mask code, responsive to said write clock signal.

9. The memory device of claim 8, wherein said special function logic loads said mask code register with the contents of said second input latch responsive to a late mask load signal received by said function input means.

10. The memory device of claim 8, further comprising:

·first and second function input terminals; wherein said function input means comprises:

a first function latch, connected to said first function input terminal, for storing the logic state of said first function input terminal responsive to said row clock signal;

a second function latch, connected to said second function input terminal, for storing the logic state of said second function input terminal responsive to said row clock signal; and a third function latch, connected to said first function input terminal, for storing the logic state of said first function input temrinal responsive to said column clock signal;

and wherein said special function logic is connected to said first, second and third function latches, said mask load signal, said non-mask write signal and said late mask load signal corresponding to various combinations of the contents of said first, second and third fucntion latches.

11. The memory device of claim 5, further comprising:
   a transfer control terminal;
   a register;
   a serial output terminal, connected to said register, for serially presenting the contents of said register; and
   means for transferring the contents of a plurality of memory cells in said selected row to said register responsive to a transfer signal received at said transfer control terminal.

* * * * *